United States Patent
Huang et al.

(10) Patent No.: US 7,754,820 B2
(45) Date of Patent: Jul. 13, 2010

(54) FLUORINATED HALF ESTER OF MALEIC ANHYDRIDE POLYMERS FOR DRY 193 NM TOP ANTIREFLECTIVE COATING APPLICATION

(75) Inventors: Wu-Song S. Huang, Poughkeepsie, NY (US); Wenjie Li, Poughkeepsie, NY (US); Pushkara R. Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 12/176,440

(22) Filed: Jul. 21, 2008

(65) Prior Publication Data
US 2008/0286686 A1   Nov. 20, 2008

Related U.S. Application Data

(62) Division of application No. 11/425,529, filed on Jun. 21, 2006, now Pat. No. 7,435,537.

(51) Int. Cl.
*G03F 7/11* (2006.01)
*C08F 22/16* (2006.01)
*C08F 283/12* (2006.01)

(52) U.S. Cl. ............... 525/327.7; 525/479; 525/245; 430/272.1; 430/273.1; 430/311; 438/952; 526/245

(58) Field of Classification Search ............ 525/327.7; 526/245
See application file for complete search history.

(56) References Cited

U.S. PATENT DOCUMENTS

| | | | | |
|---|---|---|---|---|
| 5,385,999 | A * | 1/1995 | D'Anvers et al. | 528/21 |
| 5,770,656 | A * | 6/1998 | Pechhold | 525/326.4 |
| 6,057,080 | A | 5/2000 | Brunsvold et al. | |
| 6,087,422 | A * | 7/2000 | Probst et al. | 524/114 |
| 6,184,329 | B1 * | 2/2001 | Jost et al. | 528/15 |
| 6,274,295 | B1 | 8/2001 | Dammel et al. | |
| 6,534,239 | B2 | 3/2003 | Varanasi et al. | |
| 6,635,401 | B2 | 10/2003 | Li et al. | |
| 6,949,325 | B2 | 9/2005 | Li et al. | |
| 7,521,172 | B2 * | 4/2009 | David et al. | 430/270.1 |
| 2003/0055193 | A1 * | 3/2003 | Lichtenhan et al. | 528/10 |
| 2004/0137362 | A1 * | 7/2004 | De et al. | 430/270.1 |
| 2006/0111550 | A1 | 5/2006 | Hata et al. | |
| 2006/0127803 | A1 | 6/2006 | Jung et al. | |
| 2006/0127804 | A1 | 6/2006 | Jung et al. | |
| 2006/0275697 | A1 | 12/2006 | Hata et al. | |
| 2007/0254236 | A1 * | 11/2007 | Allen et al. | 430/270.1 |

FOREIGN PATENT DOCUMENTS

GB   1352975 A  *  5/1974
WO   WO-03/033603 A1  *  4/2003

OTHER PUBLICATIONS

Evenson, et al., "Surface Esterification od Poly(Ethylene-*alt*-Anhydride) Copolymer" *Journal of Physical Chemistry B* 104:10608-10611 (2000).
Lee, et al., "The Simultaneous Analysis of Multi-Contrast Neutron and X-ray Grazing Incidence Reflection Data From Amphiphilic Layers" *Physica B* 221:159-167 (1996).

* cited by examiner

*Primary Examiner*—Cynthia Hamilton
(74) *Attorney, Agent, or Firm*—Scully, Scott, Murphy & Presser, P.C.; Steven Capella, Esq.

(57) ABSTRACT

The present invention discloses a composition suitable for use as a top antireflective coating and barrier layer for 193 nm lithography. The inventive composition is soluble in aqueous base solutions and has low refractive index at 193 nm. The inventive composition comprises an aqueous base-soluble polymer having a backbone and a fluorinated half ester moiety. The fluorinated half ester moiety is pendant from the backbone. The present invention also discloses a method of forming a patterned layer on a substrate by using the inventive composition in lithography.

16 Claims, No Drawings

FLUORINATED HALF ESTER OF MALEIC ANHYDRIDE POLYMERS FOR DRY 193 NM TOP ANTIREFLECTIVE COATING APPLICATION

RELATED APPLICATIONS

This application is a divisional of U.S. patent application Ser. No. 11/425,529, filed Jun. 21, 2006.

FIELD OF THE INVENTION

The present invention relates to a top anti-reflective coating ("TARC") material and barrier layer and the use thereof in lithographic processes. Particularly, the present invention provides a TARC material that is aqueous base-soluble and has a low refractive index (n) at 193 mm.

BACKGROUND OF THE INVENTION

In the microelectronics industry as well as in other industries involving construction of microscopic structures (e.g., micromachines, magnetoresistive heads, etc.), there is a continued desire to reduce the size of structural features. In the microelectronics industry, the desire is to reduce the size of microelectronic devices and/or to provide greater amount of circuitry for a given chip size.

Effective lithographic techniques are essential to achieve reduction of feature sizes. Lithography impacts the manufacture of microscopic structures not only in terms of directly imaging patterns on the desired substrate, but also in terms of making masks typically used in such imaging. Typical lithographic processes involve formation of a patterned resist layer by patternwise exposing the radiation-sensitive resist to an imaging radiation. The image is subsequently developed by contacting the exposed resist layer with a base solution, typically an aqueous alkaline developer, to selectively remove portions of the resist layer to obtain the desired pattern. The pattern is subsequently transferred to an underlying material by etching the material in openings of the patterned resist layer. After the transfer is complete, the remaining resist layer is then removed.

For many lithographic imaging processes, the resolution of the resist image may be limited by anomalous effects associated with refractive index mismatch and undesired reflections of imaging radiation. To address these problems, antireflective coatings are often employed between the resist layer and the substrate (bottom antireflective coating, also known as BARC) and/or between the resist and the atmosphere in the physical path along which the imaging radiation is transmitted (top antireflective coating, also known as TARC).

For immersion lithography, there are some concerns that certain components in the photoresist may leach out to the immersion medium and change the performance of the photoresist, or that the immersion medium may diffuse into the photoresist and affect the acid generation thereby adversely interfering with the chemical amplification mechanism. To alleviate these problems, a top coat material can be used between the immersion medium and the resist-coated wafer.

In the case of dry lithographic processes, such as dry 193 nm lithography (not involving an immersion fluid in the radiation exposure step), the atmosphere would typically be air. In the case of immersion lithography, the atmosphere would typically be water. Water has a refractive index (n) value of around 1.437 at 193 nm. Thus, if future immersion lithography requires fluids having refractive index (n) values above 1.6, the atmosphere would likely be hydrocarbons.

The performance of an antireflective coating composition is largely dependent on its optical characteristics at the imaging radiation wavelength of interest. A general discussion regarding typically desired optical characteristics of TARCs can be found in U.S. Pat. No. 6,274,295. Among the optical parameters of interest are the refractive index, the reflectance and the optical density of the TARC.

The antireflective coating composition must also have the desired physical and chemical performance characteristics in the context of its use in contact directly with, or in close proximity to, the resist layer and in the context of the overall lithographic process (irradiation, development, pattern transfer, etc.). Thus, the TARC should not excessively interfere with the overall lithographic process. It is highly desirable that a TARC is removed during the image development step which typically involves dissolution of a portion of the resist in an aqueous alkaline developer solution.

The existing commercial TARC compositions do not possess the combination of optical properties and physical and chemical performance characteristics needed for high resolution 193 nm dry lithography. For example, some TARC compositions have a desired refractive index below 1.5, but are not soluble in aqueous alkaline developers, thereby causing undesired complication and expense of a separate TARC removal step. Other TARC compositions have a desired refractive index, but adversely interact with the resist thus leading to excessive film loss and loss of contrast in the resulting resist image or formation of undesired T-top structures. By "T-top structure", it is meant that a low solubility thin skin layer formed on top of photoresists to create a "T" shape profile on resist images. Other TARC compositions have desired solubility in aqueous alkaline developer, but have too high a refractive index at 193 nm.

Thus, there remains a need for TARC compositions suitable for use in dry 193 nm lithographic processes that are aqueous base-soluble and have low refractive index on the order of about 1.8 or less at 193 nm. It is also desirable that these TARC compositions can be readily prepared from commercially available starting materials.

Therefore, there remains another need for TARC and barrier layer compositions suitable for use in immersion 193 nm lithographic processes that are aqueous base-soluble and have low refractive index on the order of about 1.8 or less at 193 nm. It is also desirable that these TARC compositions can be readily prepared from commercially available starting materials.

SUMMARY OF THE INVENTION

Accordingly, the present invention is directed to a composition suitable for use as a top antireflective coating and barrier layer for 193 nm lithography. The composition comprises an aqueous base-soluble polymer having a backbone and a fluorinated half ester moiety. The fluorinated half ester moiety is pendant from the backbone. Preferably, the fluorinated half ester moiety comprises the following structure:

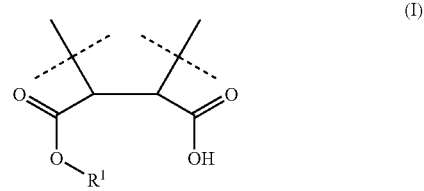

wherein $R^1$ is a fluorine-containing moiety.

The present invention also provides a method of forming a patterned layer on a substrate. The method comprises: providing a substrate having a material layer on a surface thereof; depositing a photoresist composition on the substrate to form a photoresist layer on the material; applying the inventive composition on the photoresist layer to form a top antireflective and barrier layer; pattern-wise exposing the photoresist layer and the top antireflective and barrier layer to an imaging radiation; removing the top antireflective and barrier layer and the exposed portions of the photoresist layer to form a patterned photoresist layer on the material layer; and transferring the pattern in the photoresist layer to the material layer.

DETAILED DESCRIPTION OF THE INVENTION

As stated above, the present invention provides a composition suitable for use as a top antireflective coating and barrier layer for 193 nm lithography. The inventive composition comprises an aqueous base-soluble polymer having a backbone and a fluorinated half ester moiety. The fluorinated half ester moiety is pendant from the backbone. The term "a fluorinated half ester moiety" as used herein denotes an organic moiety derived from a ring-opening reaction of a cyclic anhydride in the presence of a fluorinated alcohol. By "a fluorinated alcohol", it is meant an alcohol wherein at least a portion of the hydrogen atoms on the carbonic core are replaced by fluorine atoms. Typically, a fluorinated half ester comprises a carboxylic acid component and a fluorinated ester component, where the carboxylic acid component and the fluorinated ester component are linked through a covalent bond. While the carboxylic acid component increases the solubility of the inventive polymer in aqueous base solutions, the fluorinated ester component imparts low refractive index (n) to the inventive polymer.

In the present invention, it is preferred that the fluorinated half ester comprises the following structure:

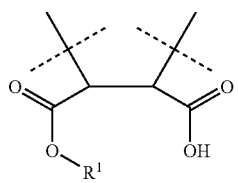

(I)

wherein $R^1$ is a fluorine-containing moiety. It should be understood by one skilled in the art that the fluorinated half ester of formula (I) is attached to the backbone of the aqueous base-soluble polymer as pendant through the covalent bonds crossed by the dotted lines. $R^1$ may be any organic group containing multiple fluorine atoms. Preferably, $R^1$ is a fluorinated aliphatic or alicyclic group having 2 to 20 carbon atoms and at least 3 fluorine atoms, which may be optionally substituted by hydroxyl, amino, N-alkyl amino having 1 to 6 carbon atoms, N,N-dialkyl amino having 2 to 12 carbon atoms, cyano, cholorine, sulfonate, and sulfonamide. The term "aliphatic group" as used herein denotes an organic group wherein the carbon atoms are linked in open chains. By "a fluorinated aliphatic group", it is meant an aliphatic group wherein at least a portion of the hydrogen atoms on the carbonic core are replaced by fluorine atoms. The term "alicyclic group" denotes an organic group where the carbon atoms are linked in ring structures. By "a fluorinated alicyclic group", it is meant an alicyclic group wherein at least a portion of the hydrogen atoms on the carbonic core are replaced by fluorine atoms. More preferably, $R^1$ is a semi- or per-fluorinated alkyl group having 2 to 20 carbon atoms and at least 3 fluorine atoms, which may be optionally substituted by hydroxyl, amino, N-alkyl amino having 1 to 6 carbon atoms, N,N-dialkyl amino having 2 to 12 carbon atoms, cyano, cholorine, sulfonate, and sulfonamide. By "semi-fluorinated alkyl group", it is meant an alkyl group wherein a portion of the hydrogen atoms on the carbonic core are replaced by fluorine atoms. By "per-fluorinated alkyl group", it is meant an alkyl group wherein all the hydrogen atoms on the carbonic core are replaced by fluorine atoms.

In preferred embodiments of the present invention, $R^1$ is selected from the group consisting of $-(CF_2)_p-CF_3$, $-(CH_2)-(CF_2)_q-CF_3$, and $-(CH_2)_2-(CF_2)_r-CF_3$; wherein p is an integer from 1 to 19, q is an integer from 1 to 18, and r is an integer from 1 to 17. Examples of $R^1$ include, but are not limited to: $-(CH_2)_2-(CF_2)-CF_3$, $-(CH_2)_2-(CF_2)_2-CF_3$, $-(CH_2)_2-(CF_2)_3-CF_3$, $-(CH_2)_2-(CF_2)_4-CF_3$, $-(CH_2)_2-(CF_2)_5-CF_3$, $-(CH_2)_2-(CF_2)_6-CF_3$, $-(CH_2)_2-(CF_2)_7-CF_3$, $-(CH_2)-(CF_2)-CF_3$, $-(CH_2)-(CF_2)_2-CF_3$, $-(CH_2)-(CF_2)_3-CF_3$, $-(CH_2)-(CF_2)_4-CF_3$, $-(CH_2)-(CF_2)_5-CF_3$, and $-(CH_2)-(CF_2)_6-CF_3$.

In the present invention, it is preferred that the inventive polymer has an ethylenic backbone. It is more preferred that the aqueous base-soluble polymer comprises monomeric units selected from the group consisting of vinyl, acrylates, methacrylates, and combinations thereof. The backbone of the aqueous base-soluble polymer is preferably free of unsaturated carbon bonds.

It is also preferred that the inventive polymer further comprises aromatic moieties. The aromatic moieties are preferably present as pendant groups from the backbone of the inventive polymer. The term "an aromatic moiety" as used herein denotes an organic compound characterized by increased chemical stability resulting from the delocalization of electrons in one or more rings which typically contain multiple conjugated double bonds. The aromatic moiety of the present invention may be carbocyclic or heterocyclic. By "carbocyclic aromatic moiety", it is meant an aromatic moiety containing only hydrogen atoms and carbon atoms. By "heterocyclic aromatic moiety", it is meant an aromatic moiety containing one or more heteroatoms selected from nitrogen, oxygen, sulfur, or a combination thereof in the aromatic ring(s). The aromatic moiety may be monocyclic or polycyclic. The rings in the polycyclic aromatic moiety may be fused or non-fused.

The aromatic moieties suitable for the present invention include, but are not limited to: fused aromatic moieties, heterocyclic aromatic moieties, and combinations thereof in substituted or unsubstituted form. Examples of the aromatic moieties include, but are not limited to: naphthalene, thiophene, and combinations thereof in substituted or unsubstituted form. The substituents on the aromatic moieties of the present invention include, but are not limited to: alkyl having 1 to 6 carbon atoms, alkenyl having 2 to 6 carbon atoms, hydroxyl, amino, N-alkyl amino having 1 to 6 carbon atoms, N,N-dialkyl amino having 2 to 12 carbon atoms, cyano, halogen, sulfonate, and sulfonamide.

The aromatic moieties can reduce the refractive index (n) of the inventive polymer as well as increase the absorption of imaging radiation. It is typically, however, preferable to avoid excessive amount of the aromatic moieties in the inventive polymer.

It is also preferred that the aqueous base-soluble polymer further comprises a Si-containing moiety. The Si-containing moiety of the present invention may be, for example, Si—Si, Si—C, Si—N, or Si—O moieties. Preferred Si-containing moieties are the SiO moieties. More preferred Si-containing moieties are silsesquioxanes.

In one embodiment of the present invention, the aqueous base-soluble polymer comprises the following structure:

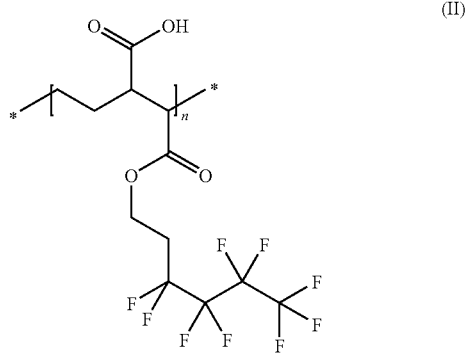

(II)

wherein n is an integer of 10 to 500.

The compositions of the present invention may further comprise at least one solvent which is preferably immiscible with the underlying resist material. Suitable solvents include, but are not limited to: water, 1-butanol, methanol, ethanol, 1-propanol, ethylene glycol, 1,2-butanediol, 1,3-butanediol, 1,4-butanediol, 1,2-propanediol, 1-pentanol, 2-pentano, 3-pentanol, 1-hexanol, 2-hexanol, 3-hexanol, 1-heptanol, 2-heptanol, 3-heptanol, 4-heptanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,4-dimethyl-3-pentanol, 3-ethyl-2-pentanol, 1-methylcyclopentanol, 2-methyl-1-hexanol, 2-methyl-2-hexanol, 2-methyl-3-hexanol, 3-methyl-3-hexanol, 4-methyl-3-hexanol, 5-methyl-1-hexanol, 5-methyl-2-hexanol, 5-methyl-3-hexanol, 4-methylcyclohexanol, 1,3-propanediol, octanol, and decane. The amount of solvent in the composition for application to a substrate is preferably sufficient to achieve a solids content of about 0.5 to about 5 wt. %. The compositions may include surfactants or other expedients known in the art.

The optical characteristics, solubility, and other physiochemical properties of the inventive polymer may be adjusted by either varying the ratio among the fluorinated half ester, the aromatic moieties, and the Si-containing moieties, or introducing functional groups into the fluorinated half ester, the aromatic moieties, and the Si-containing moieties. If desired, additional co-monomers may be introduced to modify the dissolution, casting, and other physiochemical properties of the inventive polymer. It is preferred that the inventive polymer is so prepared that the composition of the present invention has a real part of refractive index (n) at 193 nm in a range from about 1.2 to about 1.8, with a range from about 1.3 to about 1.5 more preferred. It also preferred that the inventive composition has an extinction coefficient (k) at 193 nm in a range from about 0 to about 0.25. The polymers of the invention preferably have a weight average molecular weight of at least about 1,000, more preferably a weight average molecular weight from about 1,500 to about 50,000.

The inventive polymer may be prepared by conventional polymerization techniques using commercially available and/or easily synthesized monomers. For example, the fluorinated half ester can be made by treating a commercially available cyclic anhydride with a commercially fluorinated alcohol. Therefore, the inventive polymer can be readily and economically prepared in large scales.

In another aspect of the present invention, the inventive composition may be used in a method of forming a patterned material layer on a substrate. The material layer may be, for example, a ceramic, dielectric, metal or semiconductor layer, such as those used in the manufacture of high performance integrated circuit devices and associated chip carrier packages. The inventive composition is especially useful for lithographic processes used in the manufacture of integrated circuits on semiconductor substrates. The inventive composition may be used in lithographic processes to create patterned material layer structures such as metal wiring lines, holes for contacts or vias, insulation sections (e.g., damascene trenches or shallow trench isolation), trenches for capacitor structures, ion implanted Si structures for transistors, etc. as might be used in integrated circuit devices.

In the inventive method, a photoresist composition is first deposited on the substrate by known means, to form a photoresist layer on the material. The substrate with the photoresist layer may then be baked (post-apply bake, herein after "PAB") to remove any solvent from the photoresist composition and improve the coherence of the photoresist layer. A typical PAB baking temperature is about 80° to about 150° C. A typical photoresist thickness is about 100 to about 500 nm. Any suitable resist composition may be used, such as the resist composition disclosed in U.S. Pat. Nos. 6,534,239 and 6,635,401 B2, and U.S. patent application Ser. No. 10/663,553, filed Sep. 16, 2003, the disclosures of which are incorporated herein by reference.

Next, the inventive composition is applied on the photoresist layer to form a top antireflective and barrier layer. The top antireflective and barrier layer substantially reduces the substrate reflectivity with respect to 193 nm radiation. If desired, a bottom antireflective coating may be applied to the substrate prior to formation of the resist layer. The inventive composition is preferably applied directly over the photoresist layer by spin-coating. Any solvent in the inventive composition is then removed via a softbaking process. A typical softbaking temperature is about 90° C. A typical softbaking time is about 90 seconds. The thickness of the top antireflective and barrier layer is typically in the range from about 20 to about 60 nm.

The photoresist layer and the top antireflective and barrier layer is then exposed to an appropriate radiation source through a patterned mask. In one exemplary embodiment, the imaging radiation is 193 nm radiation. For 193 nm UV radiation, the total exposure energy is preferably about 100 millijoules/cm$^2$ or less, more preferably about 50 millijoules/cm$^2$ or less (e.g. 15-30 millijoules/cm$^2$). After the desired patternwise exposure, the resist layer is typically baked to further complete the acid-catalyzed reaction and to enhance the contrast of the exposed pattern. The post-exposure bake is preferably conducted at about 60° to about 175° C., more preferably about 90° to about 160° C. The post-exposure bake is preferably conducted for about 30 seconds to about 5 minutes.

The top antireflective and barrier layer and the exposed photoresist layer are then contacted with an aqueous base developer, such as 0.263 N tetramethyl ammonium hydroxide, thereby removing the top antireflective and barrier layer and the exposed portions of the photoresist layer from the coated substrate. As is known to those skilled in the art, contact with a developer forms a patterned photoresist layer on the material layer.

The pattern in the photoresist layer may then be transferred to the material layer on the underlying substrate. Typically, the transfer is achieved by reactive ion etching or some other etching technique. The method of the invention may be used to create patterned material layer structures such as metal wiring lines, holes for contacts or vias, insulation sections (e.g., damascene trenches or shallow trench isolation), trenches for capacitor structures, etc. as might be used in the design of integrated circuit devices. Alternatively, the pattern may be transferred by ion implantation to form a pattern of ion implanted material.

The processes to make these (ceramic, dielectric, metal or semiconductor) features generally involve providing a material layer or section of the substrate to be patterned, applying a layer of photoresist over the material layer or section, applying a top coat layer on the layer of photoresist, pattern-wise exposing the top coat and photoresist layers to radiation, post-exposure baking the exposed resist, developing the pattern by contacting the exposed top coat and photoresist with a developer, etching the layer(s) underlying the photoresist layer at spaces in the pattern whereby a patterned material layer or substrate is formed, and removing any remaining photoresist from the substrate. In some instances, a hard mask may be used below the photoresist layer to facilitate transfer of the pattern to a further underlying material layer or section. It should be understood that the invention is not limited to any specific lithography technique or device structure.

The following non-limiting examples are provided to further illustrate the present invention. Because the examples are provided for illustrative purposes only, the invention embodied therein should not be limited thereto.

EXAMPLE 1

Synthesis and Optical Property Characterization of a Fluorinated Half Ester of Polyethylenemaleic Anhydride Polyethylenemaleic anhydride obtained from Aldrich was dissolved in 3,3,4,4,5,5,6,6,6-nanofluoro-1-hexanol and was heated up to 135° C. overnight. The obtained polymer solution was spin-coated on a silicon wafer and then baked on a hot plate at 110° C. for 60 seconds. Then n and k values were measured with a VB-250 VASE Ellipsometer manufactured by J.A. Woollam Co. Inc. The measured optical properties of the film for this fluorinated half ester exhibited an n value of 1.464 and a k value of 0.0006598 at 193 nm.

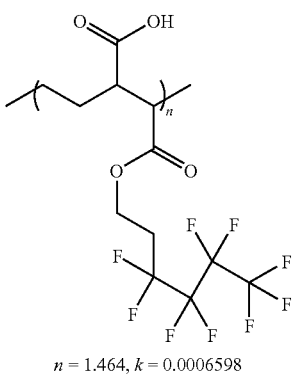

$n = 1.464, k = 0.0006598$

EXAMPLE 2

Optical Properties of Some Other Polymers and Compound Comprising Fluorinated Half Ester Synthesized One silicon containing compound and two selected polymers combining different amounts of various monomers were synthesized, and then converted to their corresponding fluorinated half esters with the method described in Example 1 except the reaction time was around 3 to 4 hours instead of overnight. The materials obtained were then measured with the method described in Example 1, and exhibited optical properties with an n value of below 1.6 at 193 nm as shown below:

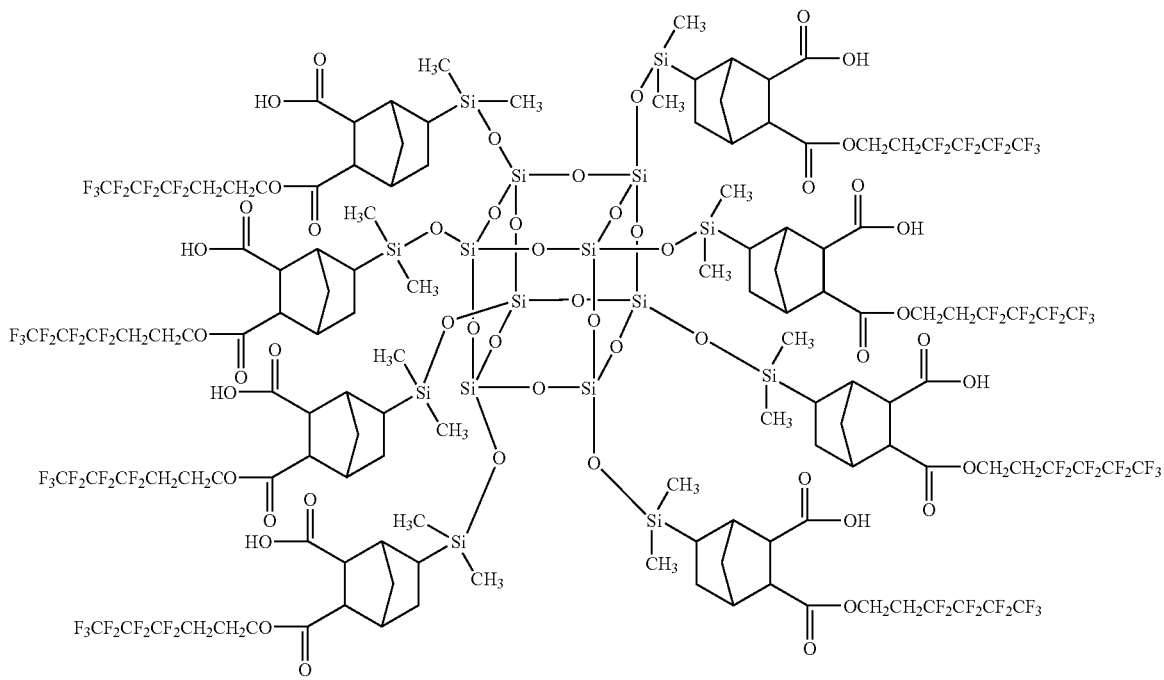

$n = 1.548, k = 0.0050$

-continued

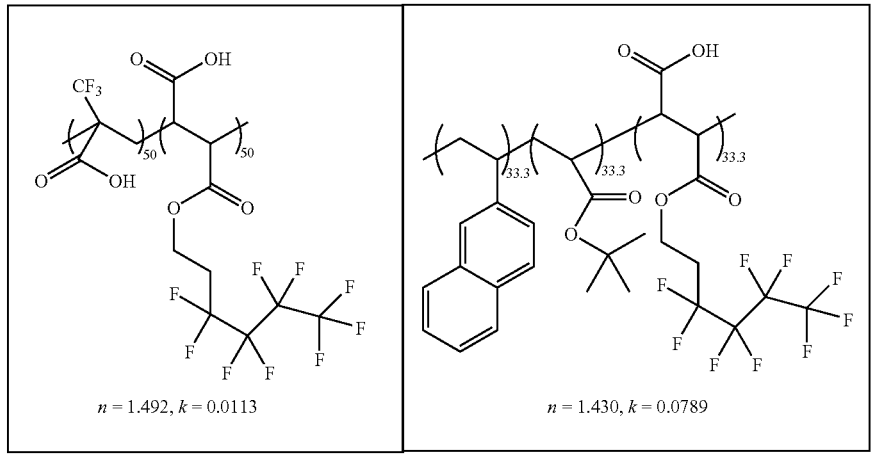

n = 1.492, k = 0.0113 n = 1.430, k = 0.0789

While the present invention has been particularly shown and described with respect to preferred embodiments thereof, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

Having thus described our invention in detail, what we claim as new and desire to secure by the Letters Patent is:

1. A composition suitable for use as a top antireflective coating and barrier layer for 193 nm lithography, said composition comprising an aqueous base-soluble polymer containing therein polymeric units containing a fluorinated half ester moiety and polymeric units containing one or more aromatic moieties selected from the group consisting of fused aromatic moieties, heterocyclic aromatic moieties, and combinations thereof in substituted or unsubstituted form, and wherein said composition has a real part of refractive index n at 193 nm in a range from about 1.2 to about 1.8.

2. The composition of claim 1, wherein the fluorinated half ester moiety comprises the following structure:

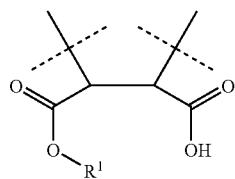

(I)

wherein $R^1$ is a fluorine-containing moiety.

3. The composition of claim 2, wherein $R^1$ is a fluorinated aliphatic or alicyclic group having 2 to 20 carbon atoms and at least 3 fluorine atoms, which is optionally substituted by one or more substituents selected from the group consisting of hydroxyl, amino, N-alkyl amino having 1 to 6 carbon atoms, N,N-dialkyl amino having 2 to 12 carbon atoms, cyano, halogen, sulfonate, and sulfonamide.

4. The composition of claim 3, wherein $R^1$ is a semi- or per-fluorinated alkyl group having 2 to 20 carbon atoms and at least 3 fluorine atoms, which is optionally substituted by one or more substituents selected from the group consisting of hydroxyl, amino, N-alkyl amino having 1 to 6 carbon atoms, N,N-dialkyl amino having 2 to 12 carbon atoms, cyano, halogen, sulfonate, and sulfonamide.

5. The composition of claim 4, wherein $R^1$ is selected from the group consisting of —$(CF_2)_p$—$CF_3$, —$(CH_2)$—$(CF_2)_q$—$CF_3$, and —$(CH_2)_2$—$(CF_2)_r$—$CF_3$; wherein p is an integer from 1 to 19, q is an integer from 1 to 18, and r is an integer from 1 to 17.

6. The composition of claim 1, wherein the aqueous base-soluble polymer contains a polymerized ethylenic portion distinct from the fluorinated half ester moiety.

7. The composition of claim 6, wherein the polymerized ethylenic portion is derived from one or more monomeric units selected from the group consisting of vinyl, acrylate, and methacrylate.

8. The composition of claim 1, wherein the one or more aromatic moieties are selected from the group consisting of naphthalene, thiophene, and combinations thereof in substituted or unsubstituted form.

9. The composition of claim 1, wherein the aqueous base-soluble polymer further comprises a Si-containing moiety.

10. The composition of claim 9, wherein the Si-containing moiety is a silsesquioxane.

11. The composition of claim 1, wherein the real part of refractive index at 193 nm is in a range from about 1.3 to about 1.6.

12. The composition of claim 1, having an extinction coefficient k at 193 nm in a range from about 0 to about 0.25.

13. The composition of claim 1, wherein the aqueous base-soluble polymer has a weight average molecular weight from about 1,500 to about 50,000.

14. The composition of claim 1, wherein the aqueous base-soluble polymer comprises the following polymer structure:

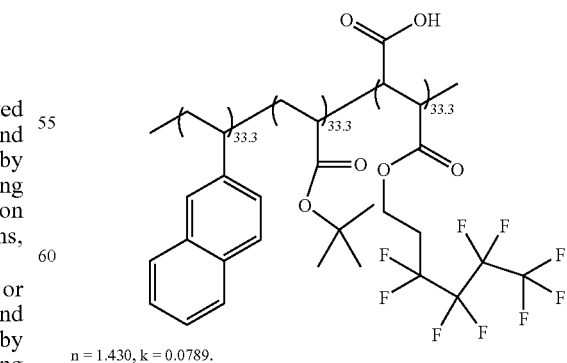

n = 1.430, k = 0.0789.

15. A composition suitable for use as a top antireflective coating and barrier layer for 193 nm lithography, said composition comprising an aqueous base-soluble polymer having the following polymer structure:

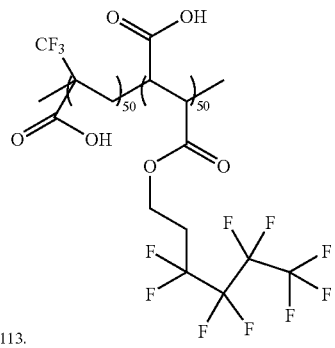

n = 1.492, k = 0.0113.

16. A composition suitable for use as a top antireflective coating and barrier layer for 193 nm lithography, said composition comprising an aqueous base-soluble polymer containing therein polymeric units containing a fluorinated half ester moiety and polymeric units containing one or more aromatic moieties selected from the group consisting of fused aromatic moieties, heterocyclic aromatic moieties, and combinations thereof in substituted or unsubstituted form, and wherein said composition has an extinction coefficient k at 193 nm in a range from about 0 to about 0.25.

* * * * *